(12) United States Patent
Itani et al.

(10) Patent No.: US 8,062,973 B2
(45) Date of Patent: Nov. 22, 2011

(54) SEMICONDUCTOR DEVICE MANUFACTURING METHOD

(75) Inventors: Takaharu Itani, Yokohama (JP); Koji Matsuo, Yokohama (JP); Kazuhiko Nakamura, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 123 days.

(21) Appl. No.: 12/693,093

(22) Filed: Jan. 25, 2010

(65) Prior Publication Data

US 2010/0190336 A1    Jul. 29, 2010

(30) Foreign Application Priority Data

Jan. 26, 2009    (JP) .................................. 2009-014325

(51) Int. Cl.
*H01L 21/44*    (2006.01)

(52) U.S. Cl. ........ 438/664; 438/308; 438/623; 438/723; 257/E21.165; 257/E21.409

(58) Field of Classification Search .................. 438/218, 438/233, 308, 586, 622, 664, 723, 789; 257/E21.165, E21.21, E21.679, E21.409, 257/E21.476
See application file for complete search history.

(56) References Cited

U.S. PATENT DOCUMENTS

| | | | |
|---|---|---|---|
| 2003/0077896 A1* | 4/2003 | Saito et al. ..................... | 438/622 |
| 2009/0008726 A1* | 1/2009 | Yamauchi et al. ............. | 257/412 |
| 2009/0011566 A1* | 1/2009 | Okada et al. .................. | 438/308 |
| 2009/0317966 A1 | 12/2009 | Matsuo et al. | |

FOREIGN PATENT DOCUMENTS

| | | |
|---|---|---|
| JP | 11-025159 | 1/1999 |
| JP | 11-251591 | 9/1999 |
| JP | 2001-203352 | 7/2001 |
| JP | 2005-019705 | 1/2005 |

* cited by examiner

*Primary Examiner* — Charles Garber
*Assistant Examiner* — Abdulfattah Mustapha
(74) *Attorney, Agent, or Firm* — Finnegan, Henderson, Farabow, Garrett & Dunner, L.L.P.

(57) ABSTRACT

A semiconductor device manufacturing method has conducting first heating processing at a first heating temperature in an inert atmosphere under a first pressure in a first process chamber to silicide an upper part of the source-drain diffusion layer and form a silicide film; conducting second heating processing at a second heating temperature in an oxidizing atmosphere under a second pressure in a second process chamber to selectively oxidize at least a surface of the metal film on the element isolating insulation film and form a metal oxide film; conducting third heating processing at a third heating temperature which is higher than the first heating temperature and the second heating temperature in an atmosphere in a third process chamber to increase a concentration of silicon in the silicide film; and selectively removing the metal oxide film and an unreacted part of the metal film on the element isolating insulation film.

20 Claims, 10 Drawing Sheets

SEMICONDUCTOR DEVICE MANUFACTURING METHOD

CROSS-REFERENCE TO RELATED APPLICATION

This application is based upon and claims the benefit of priority from the prior Japanese Patent Application No. 2009-14325, filed on Jan. 26, 2009, the entire contents of which are incorporated herein by reference.

BACKGROUND OF THE INVENTION

1. Field of the Invention

The present invention relates to a semiconductor device manufacturing method for forming silicided electrodes of MISFETs (Metal Insulator Semiconductor Field Effect Transistors).

2. Background Art

In recent years, the size shrinking of semiconductor devices has been advanced. As a result, it is demanded to shrink dimensions in a direction horizontal to a semiconductor substrate plane such as gate dimensions of transistors, the element isolating insulation film width, and the interconnection width. In addition, it is demanded to shrink dimensions in a direction perpendicular to the semiconductor substrate plane such as the height of a gate electrode and the junction depth of a source-drain diffusion layer as well.

On the other hand, it is demanded to, for example, form a low-resistance silicide film on the gate electrode and the source-drain diffusion layer to reduce parasitic resistance in these regions.

Therefore, the so-called salicide (self-aligned silicide) process for forming a low-resistance silicide film on the gate electrode or on the surface of the source-drain diffusion layer is applied (see, for example, Japanese Patent Laid-Open No. 2005-19705 and Japanese Patent Laid-Open No. 11-251591).

SUMMARY OF THE INVENTION

According to one aspect of the present invention, there is provided: a semiconductor device manufacturing method for forming a MISFET, comprising:

depositing metal and forming a metal film on a source-drain diffusion layer composed of silicon as a principal ingredient formed in a semiconductor substrate and on an element isolating insulation film formed in the semiconductor substrate in order to be adjacent to the source-drain diffusion layer;

conducting first heating processing at a first heating temperature in an inert atmosphere under a first pressure in a first process chamber, and thereby causing reaction between silicon in the source-drain diffusion layer and the metal on the source-drain diffusion layer to silicide an upper part of the source-drain diffusion layer and form a silicide film;

conducting second heating processing at a second heating temperature in an oxidizing atmosphere under a second pressure in a second process chamber to selectively oxidize at least a surface of the metal film on the element isolating insulation film and form a metal oxide film;

conducting third heating processing at a third heating temperature which is higher than the first heating temperature and the second heating temperature in an atmosphere in a third process chamber to increase a concentration of silicon in the silicide film; and selectively removing the metal oxide film and an unreacted part of the metal film on the element isolating insulation film, wherein in a time period between the first heating processing and the second heating processing, a pressure of an atmosphere in which the semiconductor substrate is placed is set in order to be lower than the second pressure.

According to another aspect of the present invention, there is provided: a semiconductor device manufacturing method for forming a MISFET, comprising:

depositing metal and forming a metal film on a gate electrode composed of silicon as a principal ingredient and on an insulation film, the gate electrode being formed on a gate insulation film, the gate insulation film being formed on a semiconductor substrate, and the insulation film being formed on both sides of the gate electrode;

conducting first heating processing at a first heating temperature in an inert atmosphere under a first pressure in a first process chamber, and thereby causing reaction between silicon in the gate electrode and the metal on the gate electrode to silicide an upper part of the gate electrode and form a silicide film;

conducting second heating processing at a second heating temperature in an oxidizing atmosphere under a second pressure in a second process chamber to selectively oxidize at least a surface of the metal film on the insulation film and form a metal oxide film;

conducting third heating processing at a third heating temperature which is higher than the first heating temperature and the second heating temperature in an atmosphere in a third process chamber to increase a concentration of silicon in the silicide film; and selectively removing the metal oxide film and an unreacted part of the metal film on the insulation film, wherein in a time period between the first heating processing and the second heating processing, a pressure of an atmosphere in which the semiconductor substrate is placed is set in order to be lower than the second pressure.

DETAILED DESCRIPTION

First, problems concerning the salicide technique of the source-drain of the MISFET newly acquired from experiments conducted by the present inventors will now be described.

COMPARATIVE EXAMPLE

Figure 1A:
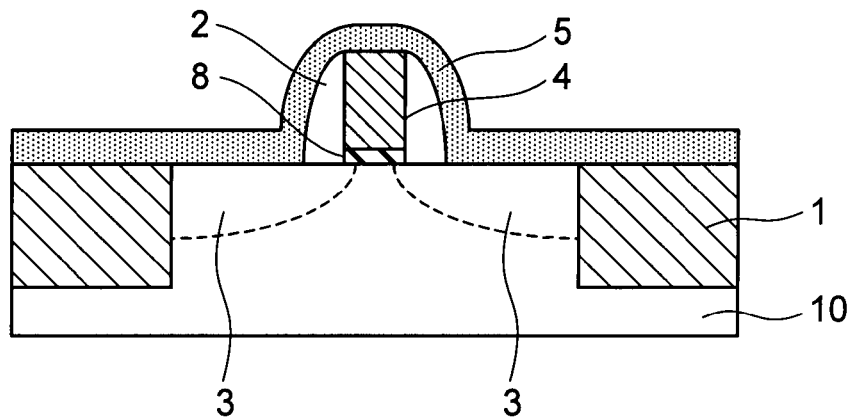
FIG. 1A is a diagram showing a sectional view in a step of a salicide process of a MISFET which is a comparative example.
Figure 1B:
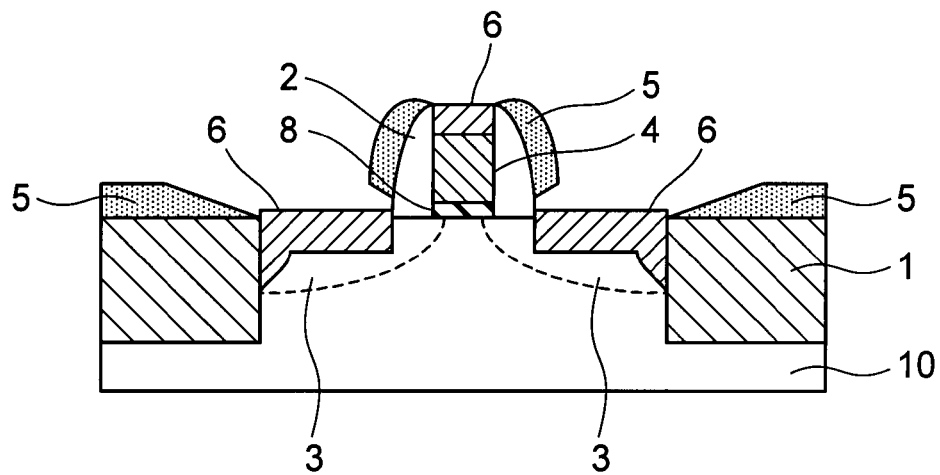
FIG. 1B is a diagram showing a sectional view in respective a step of the salicide process of the MISFET which is the comparative example, and is continuous from FIG. 1A.
Figure 1C:
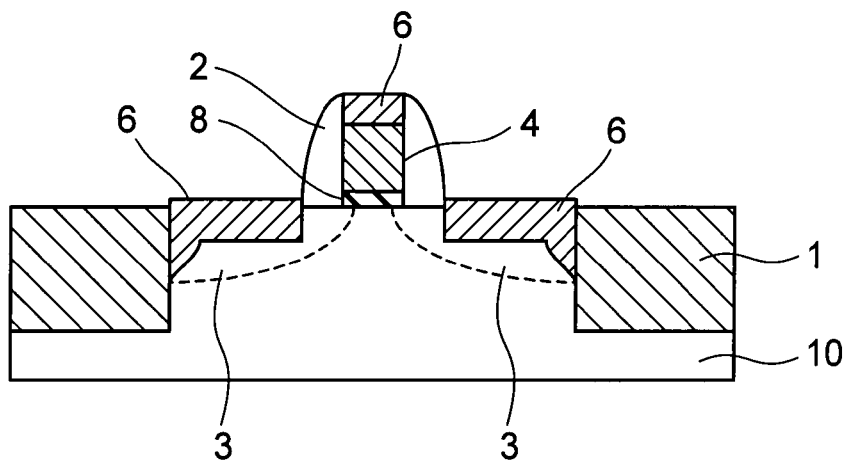
FIG. 1C is a diagram showing a sectional view in respective a step of the salicide process of the MISFET which is the comparative example, and is continuous from FIG. 1B.
Figure 2:
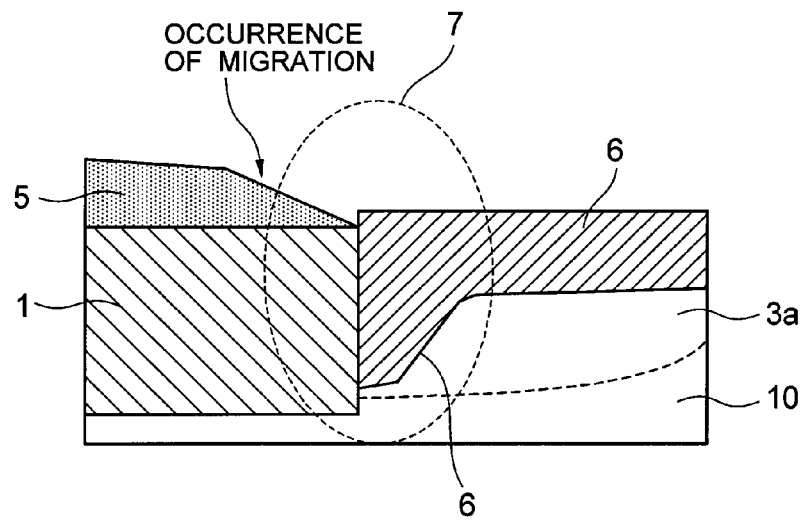
FIG. 2 is a diagram showing the vicinity of a boundary between an element isolation region and an element region in the step shown in FIG. 1B.

FIGS. 1A to 1C are diagrams showing sectional views in respective steps of a salicide process of a MISFET which is a comparative example. FIG. 2 is a diagram showing the vicinity of a boundary between an element isolation region and an element region in the step shown in FIG. 1B. The salicide process is a manufacturing method for forming silicide selectively only in a part where silicon (Si) is exposed to the surface.

First, an element isolating insulation film 1 composed of an insulator such as $SiO_2$ or SiN is formed in an upper part of a silicon substrate 10 composed of silicon as its principal ingredient. As a result, an element region and an element isolation region are formed. A gate insulation film 8 composed of MISFET is formed on the element region of the silicon substrate 10. A gate electrode 4 composed of polysilicon is formed on the gate insulation film 8. The gate insulation film 8 and the gate electrode 4 are patterned by using the lithography technique.

A source-drain diffusion layer 3 composed of silicon as its principal ingredient is formed at the surface of the silicon substrate 10 so as to have the gate electrode 4 between by implanting impurities into the element region. A gate side wall 2 composed of an insulator such as $SiO_2$ or SiN is formed on both sides of the gate electrode 4.

As shown in FIG. 1A, a metallic film 5 for conducting siliciding is formed on the surface of $SiO_2$ or SiN of the element isolating insulation film 1 and the gate side wall 2 and the surface of the source-drain diffusion layer 3 and the gate electrode 4 to which Si is exposed.

Then, heating processing is conducted, for example, in a nitrogen atmosphere and thereby an upper part of the source-drain diffusion layer 3 and an upper part of the gate electrode 4 are selectively silicided to form a silicide film 6 as shown in FIG. 1B. On the other hand, the metallic film 5 on the surface of the element isolating insulation film 1 composed of $SiO_2$ or SiN and the surface of the gate side wall 2 remains unreacted.

Then, unreacted metal on the surface of the element isolating insulation film 1 and the surface of the gate side wall 2 is removed by using a chemical which dissolves the unreacted metallic film 5 and which does not dissolve the silicide film 6 as shown in FIG. 1C. As a result, the silicide film 6 is formed only in a part in which Si is exposed.

If the silicide film 6 contains precious metal such as platinum (Pt) or palladium (Pd), then, for example, aqua regia is selected as the chemical.

Problems in the case where Ni silicide using, for example, Ni containing Pt as concrete metal is formed will now be described.

Figure 3:
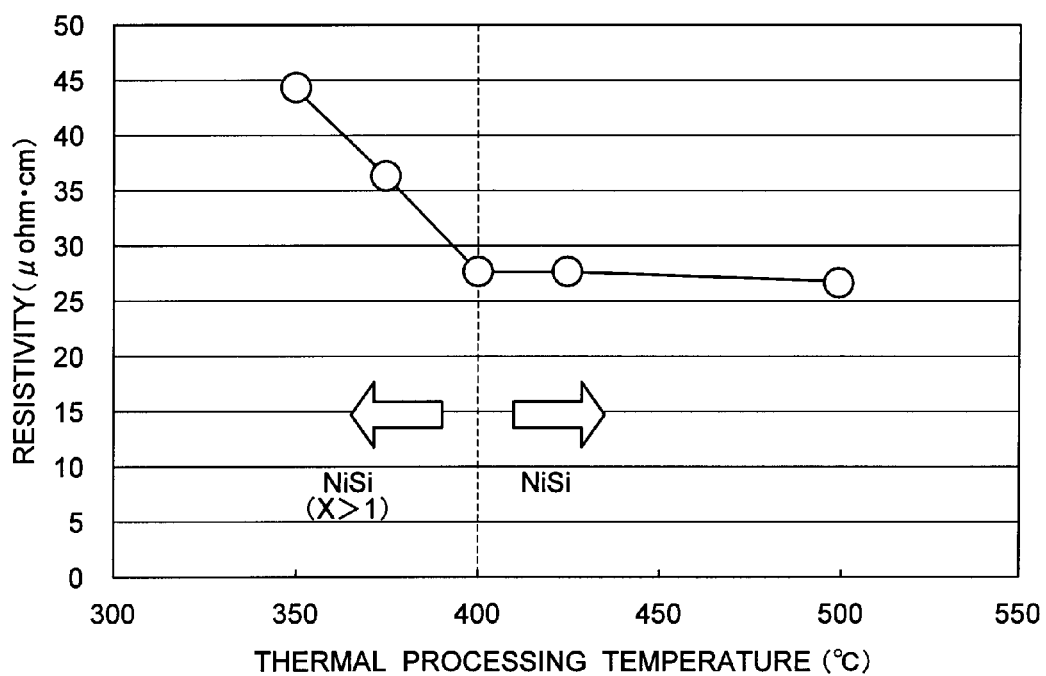
FIG. 3 is a diagram showing the resistivity of the Ni silicide film containing Pt formed on the silicon substrate as a function of temperature of heating processing.

FIG. 3 is a diagram showing the resistivity of the Ni silicide film containing Pt formed on the silicon substrate as a function of temperature of heating processing. In FIG. 3, the time of heating processing is set equal to 30 seconds as an example.

It is appreciated that the composition of Ni silicide changes from $Ni_XSi$ (X>1) to NiSi when the temperature of heating processing is 400° C. or more and the heating time is 30 seconds as shown in FIG. 3.

In the step shown in FIG. 1C, aqua regia is used as the chemical for removing (etching) the metallic film 5 because the metallic film 5 contains Pt which is precious metal, as already described. At the time of this etching, it is necessary to prevent the silicide film 6 formed on the source-drain diffusion layer 3 and the gate electrode 4 from being oxidized.

Therefore, the heating processing in the step shown in FIG. 1B is conducted at a relatively high temperature, specifically at 400° C. or more, and X in $Ni_XSi$ is made close to unity to the utmost (FIG. 3). In other words, it is necessary to make Ni silicide close to NiSi having high resistance to oxidation.

For example, if the heating processing is conducted at a temperature lower than 400° C., Ni rich silicide having a composition of X>1 is formed and oxidized by aqua regia as shown in FIG. 3. In this case, a desired resistance value of the silicide film 6 cannot be obtained.

On the other hand, in the heating processing at a high temperature (for example, at 400° C. or more) already described, the metallic film (Ni) 5 formed on the element isolating insulation film 1 causes migration in a boundary part 7 located between the element isolation region and the element region during the heating processing as shown in FIG. 2. As a result, in the boundary part 7 of the source-drain diffusion layer 3, Ni on the element isolating insulation film 1 migrates and flows into the source-drain diffusion layer 3. Accordingly, the thick silicide film 6 is formed so as to be thick in the boundary part 7.

Therefore, there is a problem that junction leak characteristics in the boundary part 7 of the source-drain diffusion layer 3 are degraded.

The metallic film (Ni) 5 on the gate side wall 2 also causes migration during the heating processing in the same way. As a result, Ni on the gate side wall 2 migrates on both sides of the gate electrode 4 and flows into the gate electrode 4. Accordingly, the silicide film 6 is formed so as to be thick on both sides of the gate electrode 4. This results in a problem that junction leak characteristics (such as the threshold voltage) of the MISFET change.

In order to solve the above-described problems, an object of the present invention is to provide a semiconductor device manufacturing method concerning the salicide technique for conducting metallization of the source-drain gate part of the MISFET.

Embodiments according to the present invention will be described with reference to the drawings.

First Embodiment

In the present embodiment, an example of a semiconductor device manufacturing method concerning the salicide technique for conducting metallization on the source-drain gate part of the MISFET will be described. The following is a rough example of its process.

1) In the same way as the ordinary salicide technique, a source-drain diffusion layer composed of Si, SiGe, SiC or the like is formed, and a film of Ni containing Pt is formed over the whole face of the wafer.

2) Si or SiGe in the source-drain diffusion layer is silicided to form a Ni silicide film by first heating processing in an inactive atmosphere under a first pressure.

3) An unreacted Ni film on an element isolating insulation film and the like is oxidized to form a Ni oxide film by second heating processing in an oxidizing atmosphere under a second pressure.

4) The composition of the Ni silicide film is made Si rich by conducting third heating processing at a temperature which is higher than that of the second heating processing.

5) The Ni oxide film and Pt are removed by aqua regia.

In a semiconductor device manufacturing method according to one aspect of the present invention, flow of Ni into the source-drain diffusion layer is prevented by oxidizing Ni on the element isolating insulation film and changing it to Ni oxide prior to conducting the third heating processing at the high temperature.

As a result, a desired silicide film is formed to reduce the junction leak of the MISFET.

In addition, in a time period between the first heating processing and the second heating processing, a pressure of an atmosphere in which the semiconductor substrate is placed is set so as to be lower than the second pressure.

As a result, the time required to replace the inert atmosphere in the process chamber by an oxidizing atmosphere can be shortened. In other words, the productivity of the semiconductor devices can be improved.

Hereafter, a semiconductor device manufacturing method for forming the MISFET according to the first embodiment will be described in detail, paying attention to the salicide process of the MISFET.

Hereafter, the case where the first heating processing is conducted in a first process chamber, the second processing is conducted in a second process chamber, and the third heating processing is conducted in a third process chamber will be described. However, these process chambers may be the same process chamber. For example, a heating source such as a halogen lamp is used in these kinds of heating processing.

FIGS. 4A to 4C, and FIGS. 5A and 5B are diagrams showing sectional views in respective steps of the semiconductor device manufacturing method according to the first embodiment.

First, an element region and an element isolation region are formed by forming an element isolating insulation film 1 composed of an insulator such as $SiO_2$ or SiN in an upper part of a silicon substrate (semiconductor substrate) 10 composed of silicon as its principal ingredient in the same way as the comparative example already described. A gate insulation film 8 of the MISFET is formed on the element region of the silicon substrate 10. A gate electrode 4 composed of polysilicon (silicon as its principal ingredient) is formed on the gate insulation film 8. The gate insulation film 8 and the gate electrode 4 are patterned by using, for example, the lithography technique.

A source-drain diffusion layer 3 composed of silicon as its principal ingredient is formed at the surface of the silicon substrate 10 so as to have the gate electrode 4 between by implanting impurities into the element region. A gate side wall 2 composed of an insulator such as $SiO_2$ or SiN is formed on both sides of the gate electrode 4. The source-drain diffusion layer 3 and the gate electrode 4 may contain germanium (Ge) or carbon (C).

Figure 4A:
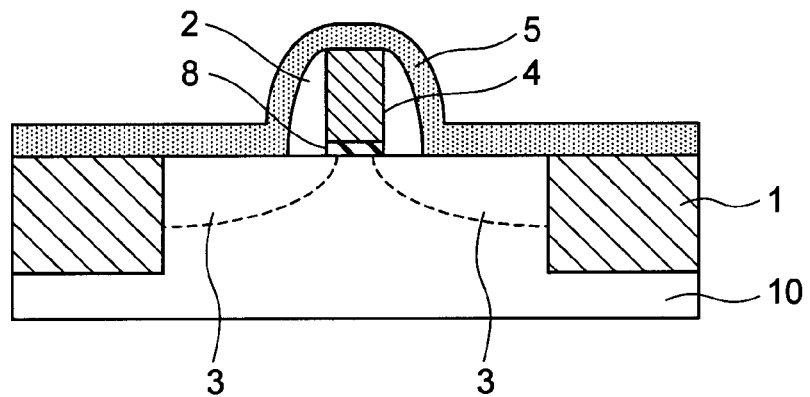
FIG. 4A is a diagram showing a sectional view in a step of the semiconductor device manufacturing method according to the first embodiment.

As shown in FIG. 4A, metal is deposited on the surface of $SiO_2$ or SiN of the element isolating insulation film 1 and the gate side wall 2 and the surface of the source-drain diffusion layer 3 and the gate electrode 4 to which Si is exposed, by using CVD (Chemical Vapor Deposition) or the like. As a result, a metallic film 5 for siliciding is formed.

In the present embodiment, for example, nickel (Ni) is selected as the metal for siliciding. This metal may be cobalt, titanium, or the like.

The metallic film 5 may contain precious metal such as platinum (Pt) or palladium (Pd). As a result, it can be facilitated to control the composition of a silicide film formed later by heating processing so as to attain a desired composition (for example, NiSi).

In the present embodiment, the metallic film 5 contains Pt. In this case, metal (Ni) deposited by the CVD contains Pt.

Reaction between silicon in the source-drain diffusion layer 3 and the metal (Ni) on the source-drain diffusion layer 3 is caused in the inert atmosphere having the first pressure in the process chamber (first process chamber) by first heating processing h1 at a first heating temperature (for example, 300° C.). As a result, the upper part of the source-drain diffusion layer 3 is silicided to form a silicide film 106.

Figure 4B:
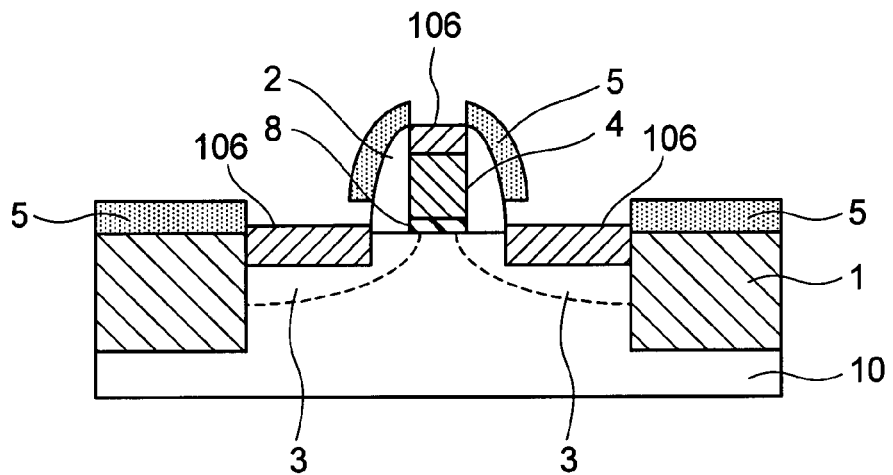
FIG. 4B is a diagram showing a sectional view in a step of the semiconductor device manufacturing method according to the first embodiment, and is continuous from FIG. 4A.

In the same way, reaction between silicon in the gate electrode 4 and the metal (Ni) on the gate electrode 4 is caused by the first heating processing h1. As a result, an upper part of the gate electrode 4 is silicided to form a silicide form 106 (FIG. 4B).

As already described, the first heating processing h1 is conducted in the inert atmosphere. This inert atmosphere is, for example, an atmosphere having a nitrogen concentration of at least 99% (especially, an atmosphere having an oxygen concentration of 1% or less). As a result, the silicide film (Ni silicide) 106 containing Pt is formed selectively on the source-drain diffusion layer 3 and the gate electrode 4. The metallic film (Ni) 5 on the surface of the element isolating insulation film 1 and on the surface of the gate side wall 2 remains unreacted.

In the comparative example, it is necessary to conduct heating processing at approximately 400° C. or more so as to prevent the Ni silicide from being oxidized by aqua regia later.

In the present first embodiment, however, the first heating temperature of the first heating processing h1 is set equal to such a temperature that migration is not caused in the metallic film (Ni), for example, 400° C. or less, preferably approximately 300° C. In other words, the first heating temperature is lower than the temperature of the heating processing in the comparative example.

As a result, it is possible to prevent Ni on the surface of the element isolating insulation film 1 and Ni on the surface of the gate side wall 2 from flowing into the source-drain diffusion layer 3 and the gate electrode 4 due to migration. In other words, it is possible to prevent the film thickness of the silicide film from increasing more than needed as shown in, for example, FIG. 2 in the comparative example.

On the other hand, since the first heating processing h1 is low temperature thermal processing (for example, 300° C.), the composition $Ni_xSi$ of the silicide film becomes Ni rich composition with X>1 as shown in FIG. 3 and already described.

Although the first pressure is, for example, the atmospheric pressure (in the range of 700 to 800 Torr), the first pressure may be set equal to 100 Torr or less as occasion demands.

Figure 4C:
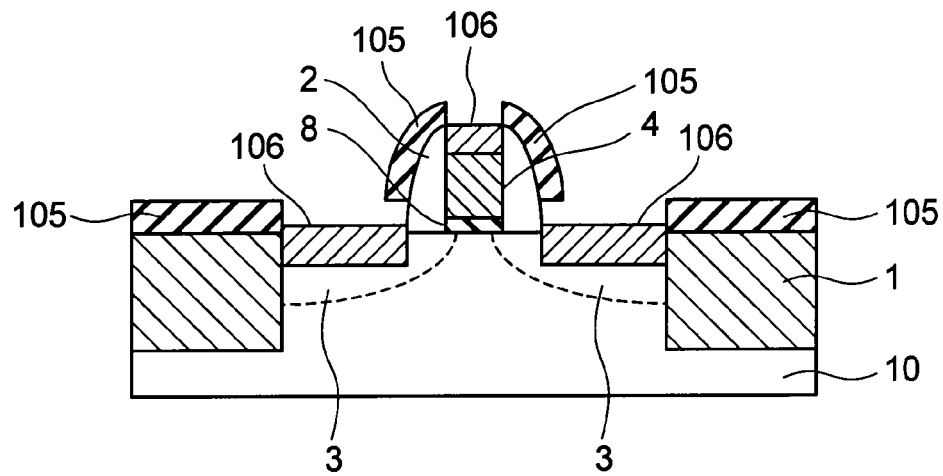
FIG. 4C is a diagram showing a sectional view in a step of the semiconductor device manufacturing method according to the first embodiment, and is continuous from FIG. 4B.

Then, in an oxidizing atmosphere under the second pressure in the process chamber (the second process chamber), at least the surface of the metallic film 5 on the surface of the element isolating insulation film 1 and on the surface of the gate side wall 2 is selectively oxidized so as not to oxidize the silicide film 106, by the second heating processing h2 at a second heating temperature. As a result, a metal oxide film 105 is formed (FIG. 4C).

In other words, unreacted Ni on the surface of the element isolating insulation film 1 and the surface of the gate side wall 2 is oxidized by conducting oxidation (thermal oxidation) in the oxidizing atmosphere, for example, at approximately 300° C., resulting in a Ni oxide film.

At this time, all of the unreacted metallic (Ni) film 5 may be made a metal oxide film, or only the surface layer part may be oxidized. Which degree the metal oxide film is to be formed depends upon which degree the silicide film 106 is to be made thin near the boundary.

As for the condition of the second heating processing (oxidation processing) h2, the degree that silicide formed on the source-drain diffusion layer is not oxidized or slightly oxidized (in other words, the degree that the resistivity of the silicide film 106 is not influenced) is desirable. The above-described thermal oxidation at approximately 300° C. satisfies the condition.

By thus oxidizing at least the surface of the metallic film 5 to form the metal oxide film 105, it is possible to prevent the heating processing (the third heating processing h3) conducted later from causing migration of the metal (Ni).

Incidentally, oxidation (wet oxidation) using a chemical containing an oxidizing agent such as, for example, ozone ($O_3$) water may be applied to the second heating processing h2. Oxidation using plasma oxygen may be applied to the second heating processing h2. According to these methods, the metal oxide film 105 can be formed at a temperature lower than that in the thermal oxidation, and oxidation of the silicide film 106 can be suppressed more.

In addition, the second pressure is, for example, the atmospheric pressure (in the range of 700 to 800 Torr).

Especially in the present embodiment, the pressure of the atmosphere in which the semiconductor substrate 10 is placed is depressurized and set so as to be lower than the second pressure, in a time period between the first heating processing h1 and the second heating processing h2.

As a result, the time required to replace the inert atmosphere in the process chamber (the second process chamber) by the oxidizing atmosphere can be shortened. In other words, productivity of the semiconductor device can be improved.

If processing using aqua regia is conducted after the above-described oxidation processing (the second heating processing h2), then the Ni-rich silicide film 106 in the source-drain diffusion layer 3 is oxidized.

Figure 5A:
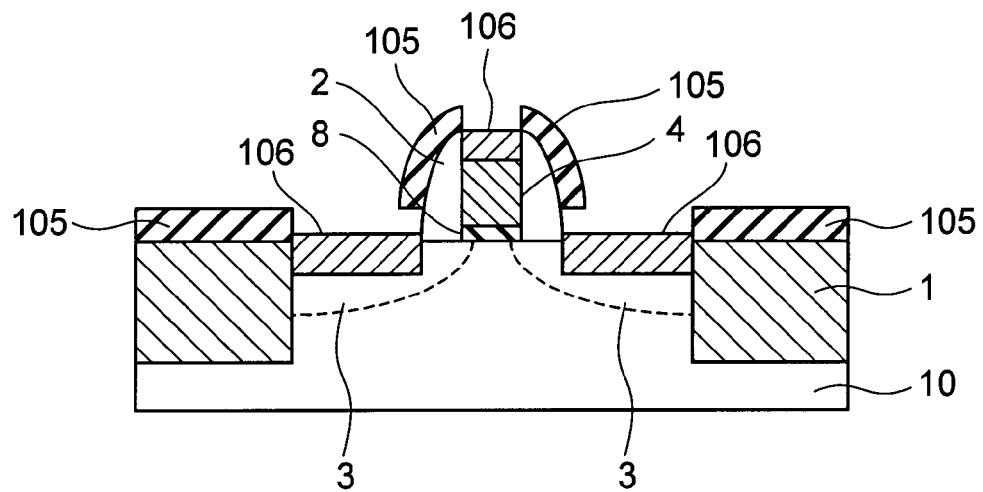
FIG. 5A is a diagram showing a sectional view in a step of the semiconductor device manufacturing method according to the first embodiment, and is continuous from FIG. 4C.

As shown in FIG. 5A, therefore, the silicon concentration of the silicide film 106 is increased by conducting the third heating processing h3 at a third heating temperature (for example, 400° C.) which is higher than the first heating temperature and the second heating temperature (for example, 300° C.) in an atmosphere in the process chamber (the third process chamber). In other words, the composition of the silicide film 106 is made close to NiSi having resistance to oxidation as compared with $Ni_xSi$ (X>1).

As already described, in the present first embodiment, metal (Ni) on the surface of the element isolating insulation film 1 and the surface of the gate side wall 2 becomes the metal oxide film 105. Therefore, migration is suppressed and metal (Ni) does not flow into the source-drain diffusion layer 3 and the gate electrode 4.

In this way, unreacted Ni on $SiO_2$ and SiN is changed to the Ni oxide film, and then the third high-temperature heating processing h3 is conducted.

The atmosphere in the process chamber in the third heating processing h3 may be either of the inert atmosphere and the oxidizing atmosphere.

Figure 5B:
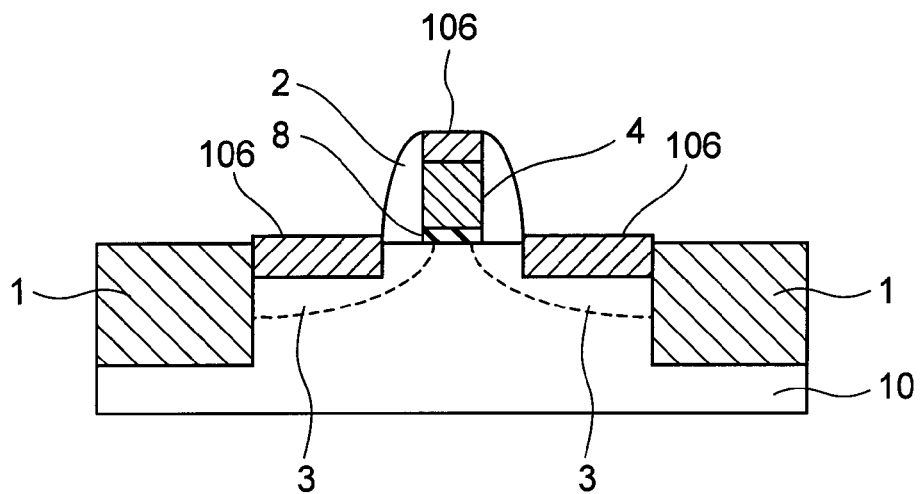
FIG. 5B is a diagram showing a sectional view in a step of the semiconductor device manufacturing method according to the first embodiment, and is continuous from FIG. 5A.

Then, as shown in FIG. 5B, the metal oxide film 105 and unreacted parts (not illustrated) of the metallic film 5 on the surface of the element isolating insulation film 1 and the surface of the gate side wall 2 are selectively removed.

In other words, the metal oxide film 105 and unreacted metal on the surface of the element isolating insulation film 1 and the surface of the gate side wall 2 are removed by using a chemical which dissolves the metal oxide film 105 and the unreacted metal film 5 and which does not dissolve the silicide film 106.

If the silicide film 106 contains precious metal such as platinum (Pt) or palladium (Pd), then, for example, aqua regia is selected as the chemical. If the silicide film 106 does not contain precious metal, then a chemical such as nitric acid hydrogen peroxide ($HNO_3+H_2O_2$), hydrochloric acid hydrogen peroxide ($HCl+H_2O_2$), or sulfuric acid hydrogen peroxide ($H_2SO_4+H_2O_2$) may also be used.

At this time, the silicide film 106 has a composition closer to Si rich silicide, specifically NiSi formed by the third heating processing h3 shown in FIG. 5A. Therefore, the silicide film 106 is not oxidized by aqua regia.

Owing to the steps heretofore described, it is possible to suppress migration of metal for siliciding and form a silicide film having a desired film thickness. As a result, it is possible to suppress the degradation of the junction leak characteristics and obtain a MISFET having desired characteristics.

In addition, the time period required to replace the inert atmosphere in the process chamber by an oxidizing atmosphere can be shortened as already described. In other words, the productivity of the semiconductor devices can be improved.

Steps shown in FIGS. 4B to 5A and already described are, for example, heating processing in the nitrogen atmosphere at 400° C. or less, oxidation processing at approximately 300° C., and heating processing in the nitrogen atmosphere at 400° C. or more, respectively. Therefore, these kinds of processing may be conducted in single sequence processing (i.e., in the same process chamber as already described).

For example, after the step shown in FIG. 4B, a wafer is introduced into a process chamber. Then, first, the first heating processing h1 is conducted in the nitrogen atmosphere at less than 400° C. For example, heating processing is conducted at 300° C. The second heating processing (oxidation) h3 is conducted by introducing oxygen gas intact.

Then, the temperature of the semiconductor substrate is raised to the third heating temperature (400° C. or more) while introducing nitrogen gas into the process chamber, and the third heating processing h3 is conducted.

As a result, the processing in the steps shown in FIGS. 4B to 5A can be conducted as single processing (in the same process chamber).

In the step shown in FIG. 4B, the first heating processing h1 is executed in the inert atmosphere at a temperature of less than 400° C. (for example, 300° C.). This inert atmosphere may contain oxygen as already described.

In other words, the first heating processing h1 aims at forming Ni silicide selectively on the source-drain diffusion layer. Therefore, the heating processing should be conducted by adjusting the oxygen concentration and the heating processing temperature so as to make the speed of reaction between Ni and Si or Ge faster than the oxidation speed of Ni.

Specifically, heating processing should be executed at 300° C. with an oxygen concentration of 1% or less as the first heating processing h1. By thus allowing an oxygen concentration up to 1%, the time period required to conduct the nitrogen replacement processing in the process chamber can be shortened in the case where alternate processing composed of the processing shown in FIG. 4B and the subsequent oxidation processing at the step shown in FIG. 4C is conducted in a single equipment (the same process chamber).

In the same way as the foregoing description, oxygen may be contained even in the third heating processing h3 conducted in the nitrogen atmosphere at a high temperature of 400° C. or more in the step shown in FIG. 5A.

Especially in the third heating processing h3 in the step shown in FIG. 5A, the present inventors have ascertained that the silicide film on the source-drain diffusion layer is little oxidized even if the processing is conducted in the oxygen atmosphere of 100%.

In the step shown in FIG. 4C and the step shown in FIG. 5A, therefore, processing in the oxidizing atmosphere may be conducted by changing only the temperature.

In the heating processing sequence as heretofore described, the processing in the steps shown in FIGS. 4B to 5A may be conducted as single processing (in the same process chamber).

Figure 6:
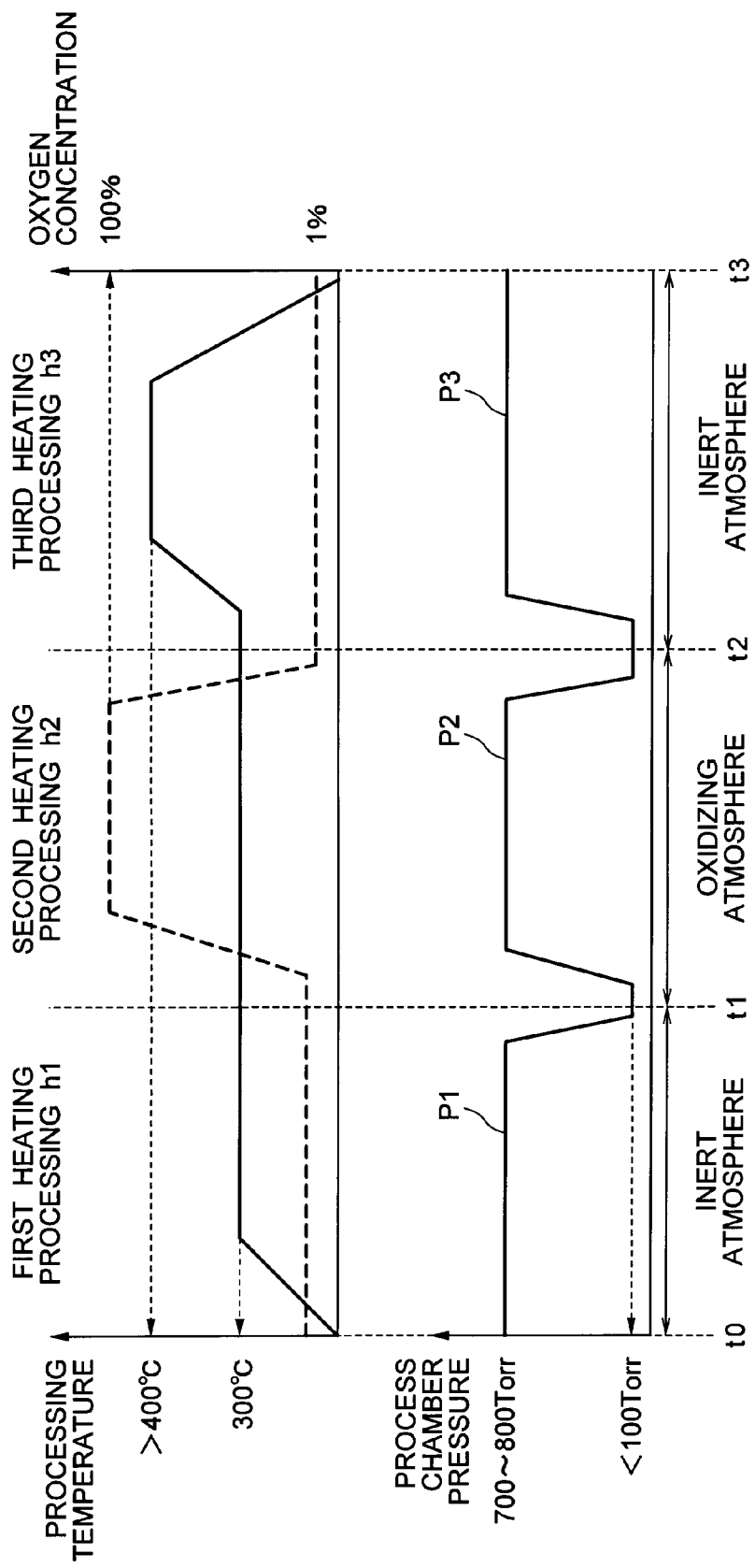
FIG. 6 is a diagram showing an example of a flow of steps in the manufacturing method of the semiconductor device shown in FIGS. 4B to 5A.

FIG. 6 is a diagram showing an example of a flow of steps in the manufacturing method of the semiconductor device shown in FIGS. 4B to 5A. In FIG. 6, the abscissa axis indicates processing time from the processing start. As for the ordinate axis, the left axis indicates the temperature and the right axis indicates the oxygen concentration.

First, in a section between time t0 and t1 shown in FIG. 6, the first heating processing h1 (the step shown in FIG. 4B) at the first heating temperature (approximately 300° C.) is conducted in the inert atmosphere (with an oxygen concentration of 1% or less) under the first pressure P1 (in the range of 700 to 800 Torr) in the process chamber.

At the time t1 between the first heating processing h1 and the subsequent second heating processing h2, the pressure of an atmosphere in which the semiconductor substrate 10 is placed is depressurized and set equal to a value (100 Torr or less) which is lower than that of the first pressure P1 and that of the second pressure P2 (in the range of 700 to 800 Torr).

As a result, the time period required to replace the inert atmosphere in the process chamber by the oxidizing atmosphere can be shortened.

Then, in a section between the time t1 and t2, the pressure in the process chamber is raised to the second pressure P2 by introducing oxygen gas into the process chamber. Subsequently, the second heating processing h2 (the step shown in FIG. 4C, here thermal oxidation) at approximately 300° C. is conducted in the oxidizing atmosphere (with an oxygen concentration of, for example, 100%) in the process chamber.

At the time t2 between the second heating processing h2 and the subsequent third heating processing h3, the pressure of an atmosphere in which the semiconductor substrate 10 is placed is depressurized and set equal to a value (100 Torr or less) which is lower than that of the second pressure P2 and that of a third pressure P3.

As a result, the time period required to replace the oxidizing atmosphere in the process chamber by the inert atmosphere can be shortened.

Then, in a section between the time t2 and t3, the pressure in the process chamber is raised to the third pressure P3 by introducing nitrogen gas into the process chamber. The third heating processing h3 (the step shown in FIG. 5A) at a third processing temperature (400° C. or more) is conducted in the inert atmosphere (with an oxygen concentration of, for example, 1%) in the process chamber.

Thereafter, the metal oxide film 105 and an unreacted part (not illustrated) of the metallic film 5 on the surface of the element isolating insulation film 1 and the surface of the gate side wall 2 are removed selectively in the step shown in FIG. 5B.

Owing to the steps heretofore described as well, it is possible to improve the productivity of the semiconductor device while suppressing migration of metal for siliciding and forming a silicide film having a desired film thickness.

Figure 7:
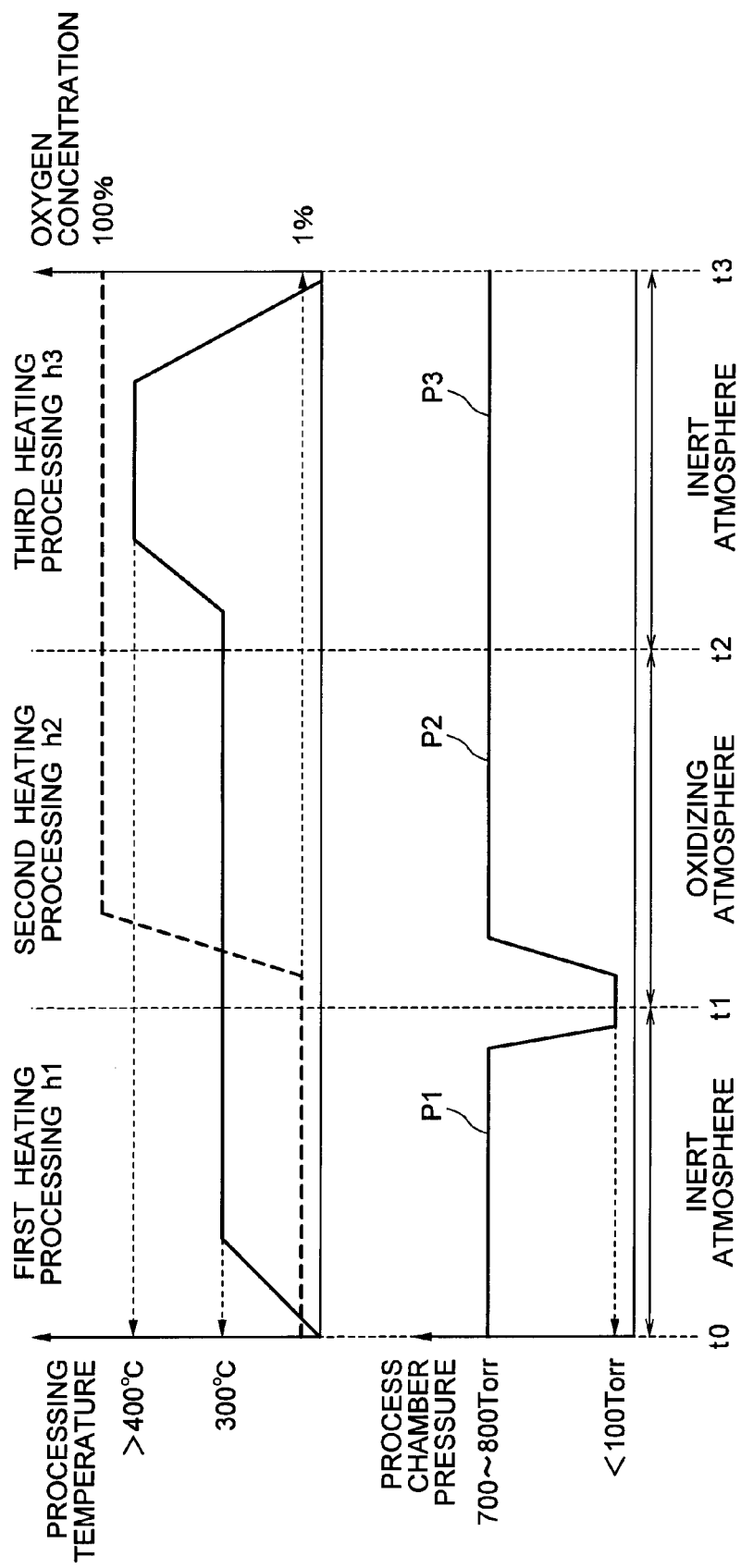
FIG. 7 is a diagram showing another example of a flow of steps in the manufacturing method of the semiconductor device shown in FIGS. 4B to 5A.

FIG. 7 is a diagram showing another example of a flow of steps in the manufacturing method of the semiconductor device shown in FIGS. 4B to 5A. In FIG. 7, the abscissa axis indicates processing time from the processing start. As for the ordinate axis, the left axis indicates the temperature and the right axis indicates the oxygen concentration.

First, in a section between time t0 and t1 shown in FIG. 7, the first heating processing h1 (the step shown in FIG. 4B) at the first heating temperature (approximately 300° C.) is conducted in the inert atmosphere (with an oxygen concentration of 1% or less) under the first pressure P1 (in the range of 700 to 800 Torr) in the process chamber.

At the time t1 between the first heating processing h1 and the subsequent second heating processing h2, the pressure of an atmosphere in which the semiconductor substrate 10 is placed is depressurized and set equal to a value (100 Torr or less) which is lower than that of the first pressure P1 and that of the second pressure P2 (in the range of 700 to 800 Torr).

As a result, the time period required to replace the inert atmosphere in the process chamber by the oxidizing atmosphere can be shortened.

Then, in a section between the time t1 and t2, the pressure in the process chamber is raised to the second pressure P2 by introducing oxygen gas into the process chamber. Subsequently, the second heating processing h2 (the step shown in FIG. 4C, here thermal oxidation) at approximately 300° C. is conducted in the oxidizing atmosphere (with an oxygen concentration of, for example, 100%) in the process chamber.

At the time t2 between the second heating processing h2 and the subsequent third heating processing h3, the pressure of an atmosphere in which the semiconductor substrate 10 is placed is kept at the second pressure P2 because there is no replacement of the atmosphere. In other words, at the time t2 between the second heating processing h2 and the third heating processing h3, the pressure of an atmosphere in which the semiconductor substrate 10 is placed is set equal to the second pressure P2 and a third pressure P3.

Then, in a section between the time t2 and t3, the pressure in the process chamber is kept at the third pressure P3 which is equal to the second pressure P2. The third heating processing h3 (the step shown in FIG. 5A) at a third processing temperature (400° C. or more) is conducted in the oxidizing atmosphere (with an oxygen concentration of, for example, 100%) in the process chamber.

Thereafter, the metal oxide film 105 and an unreacted part (not illustrated) of the metallic film 5 on the surface of the element isolating insulation film 1 and the surface of the gate side wall 2 are removed selectively in the step shown in FIG. 5B.

Owing to the steps heretofore described as well, it is possible to improve the productivity of the semiconductor device while suppressing migration of metal for siliciding and forming a silicide film having a desired film thickness.

Figure 8:
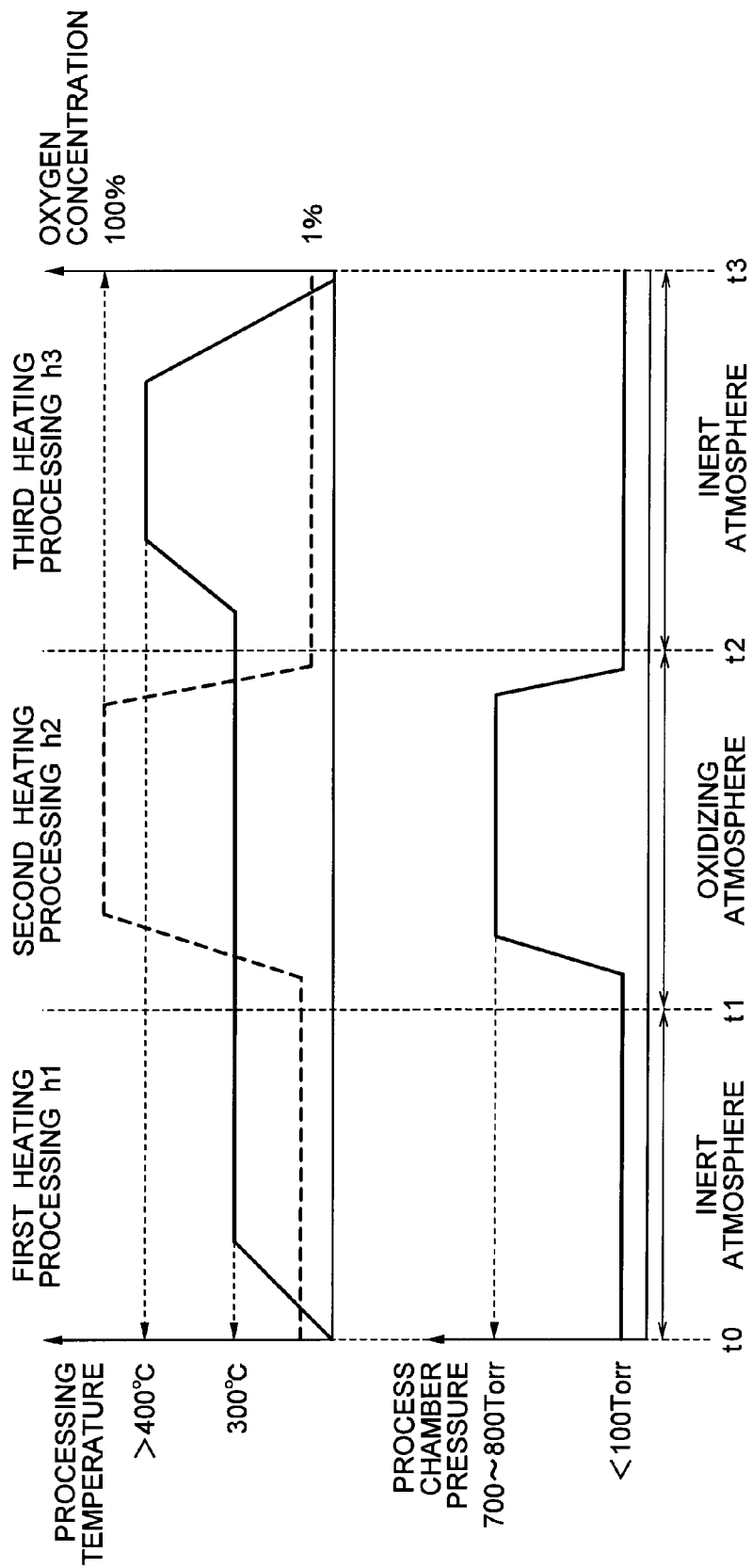
FIG. 8 is a diagram showing still another example of a flow of steps in the manufacturing method of the semiconductor device shown in FIGS. 4B to 5A.

FIG. 8 is a diagram showing still another example of a flow of steps in the manufacturing method of the semiconductor device shown in FIGS. 4B to 5A. In FIG. 8, the abscissa axis indicates processing time from the processing start. As for the ordinate axis, the left axis indicates the temperature and the right axis indicates the oxygen concentration.

First, in a section between time t0 and t1 shown in FIG. 8, the first heating processing h1 (the step shown in FIG. 4B) at the first heating temperature (approximately 300° C.) is conducted in the inert atmosphere (with an oxygen concentration of 1% or less) under the first pressure P1 (in the range of 700 to 800 Torr) in the process chamber.

At the time t1 between the first heating processing h1 and the subsequent second heating processing h2, the pressure of an atmosphere in which the semiconductor substrate 10 is placed is set equal to a value (100 Torr or less which is equal to the first pressure P1) which is lower than that of the second pressure P2 (in the range of 700 to 800 Torr).

As a result, the time period required to replace the inert atmosphere in the process chamber by the oxidizing atmosphere can be shortened.

Then, in a section between the time t1 and t2, the pressure in the process chamber is raised to the second pressure P2 by introducing oxygen gas into the process chamber. Subsequently, the second heating processing h2 (the step shown in FIG. 4C, here thermal oxidation) at approximately 300° C. is conducted in the oxidizing atmosphere (with an oxygen concentration of, for example, 100%) in the process chamber.

At the time t2 between the second heating processing h2 and the subsequent third heating processing h3, the pressure of an atmosphere in which the semiconductor substrate 10 is placed is depressurized and set equal to a value (for example, 100 Torr or less which is equal to a third pressure P3) lower than that of the second pressure P2. At this time, nitrogen gas is introduced into the process chamber.

As a result, the time period required to replace the oxidizing atmosphere in the process chamber by the inert atmosphere can be shortened.

Then, in a section between the time t2 and t3, the pressure in the process chamber is raised to the third pressure P3 by introducing nitrogen gas into the process chamber. The third heating processing h3 (the step shown in FIG. 5A) at a third processing temperature (400° C. or more) is conducted in the inert atmosphere (with an oxygen concentration of, for example, 1%) in the process chamber.

Thereafter, the metal oxide film 105 and an unreacted part (not illustrated) of the metallic film 5 on the surface of the element isolating insulation film 1 and the surface of the gate side wall 2 are removed selectively in the step shown in FIG. 5B.

Owing to the steps heretofore described as well, it is possible to improve the productivity of the semiconductor device while suppressing migration of metal for siliciding and forming a silicide film having a desired film thickness.

Figure 9:
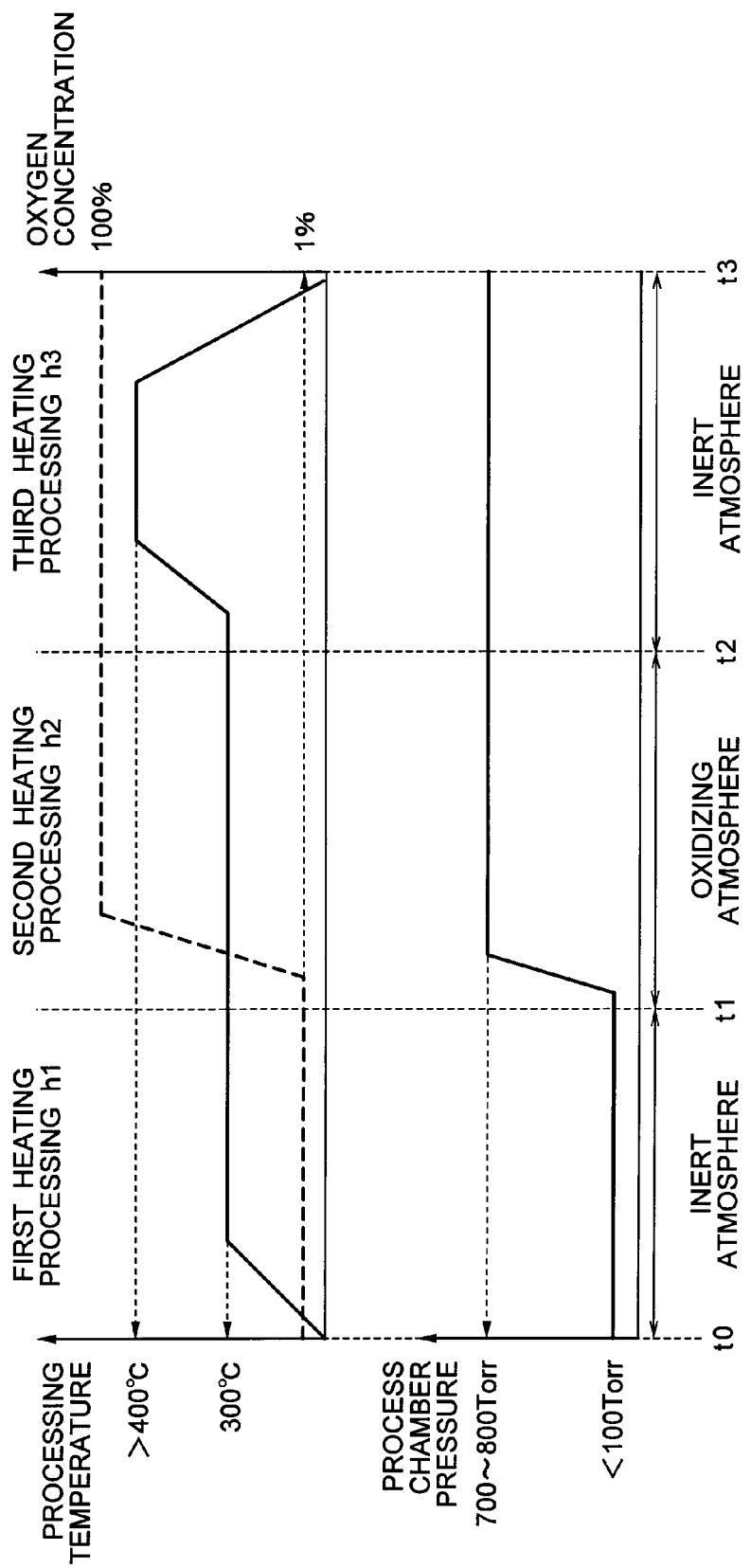
FIG. 9 is a diagram showing yet another example of a flow of steps in the manufacturing method of the semiconductor device shown in FIGS. 4B to 5A.

FIG. 9 is a diagram showing yet another example of a flow of steps in the manufacturing method of the semiconductor device shown in FIGS. 4B to 5A. In FIG. 9, the abscissa axis indicates processing time from the processing start. As for the ordinate axis, the left axis indicates the temperature and the right axis indicates the oxygen concentration.

First, in a section between time t0 and t1 shown in FIG. 9, the first heating processing h1 (the step shown in FIG. 4B) at the first heating temperature (approximately 300° C.) is conducted in the inert atmosphere (with an oxygen concentration of 1% or less) under the first pressure P1 (in the range of 700 to 800 Torr) in the process chamber.

At the time t1 between the first heating processing h1 and the subsequent second heating processing h2, the pressure of an atmosphere in which the semiconductor substrate 10 is placed is set equal to a value (100 Torr or less which is equal to the first pressure P1) which is lower than that of the second pressure P2 (in the range of 700 to 800 Torr).

As a result, the time period required to replace the inert atmosphere in the process chamber by the oxidizing atmosphere can be shortened.

Then, in a section between the time t1 and t2, the pressure in the process chamber is raised to the second pressure P2 by introducing oxygen gas into the process chamber. Subsequently, the second heating processing h2 (the step shown in FIG. 4C, here thermal oxidation) at approximately 300° C. is conducted in the oxidizing atmosphere (with an oxygen concentration of, for example, 100%) in the process chamber.

At the time t2 between the second heating processing h2 and the subsequent third heating processing h3, the pressure of an atmosphere in which the semiconductor substrate 10 is placed is kept at the second pressure P2 because there is no replacement of the atmosphere. In other words, at the time t2 between the second heating processing h2 and the third heating processing h3, the pressure of an atmosphere in which the semiconductor substrate 10 is placed is set equal to the second pressure P2 and the third pressure P3.

Then, in a section between the time t2 and t3, the pressure in the process chamber is kept at the third pressure P3 which is equal to the second pressure P2. The third heating processing h3 (the step shown in FIG. 5A) at a third processing temperature (400° C. or more) is conducted in the oxidizing atmosphere (with an oxygen concentration of, for example, 100%) in the process chamber.

Thereafter, the metal oxide film 105 and an unreacted part (not illustrated) of the metallic film 5 on the surface of the element isolating insulation film 1 and the surface of the gate side wall 2 are removed selectively in the step shown in FIG. 5B.

Owing to the steps heretofore described as well, it is possible to improve the productivity of the semiconductor device while suppressing migration of metal for siliciding and forming a silicide film having a desired film thickness.

In the manufacturing method of the semiconductor device according to the present embodiment, it is possible to improve the productivity of the semiconductor device while forming a desired silicide film, as heretofore described.

In the present embodiment, it is necessary to oxidize unreacted metal on the element isolating insulation film and oxidize the silicide film on the source-drain diffusion layer. Therefore, the metal is not restricted to Ni already described, but any metal can be applied as long as the metal forms a metal oxide.

Second Embodiment

In the second embodiment, concrete operation of a thermal processing equipment including first to third process chambers to conduct the first to third heating processing already described will be described together with the flow in the steps in the manufacturing method of the semiconductor device.

Figure 10:
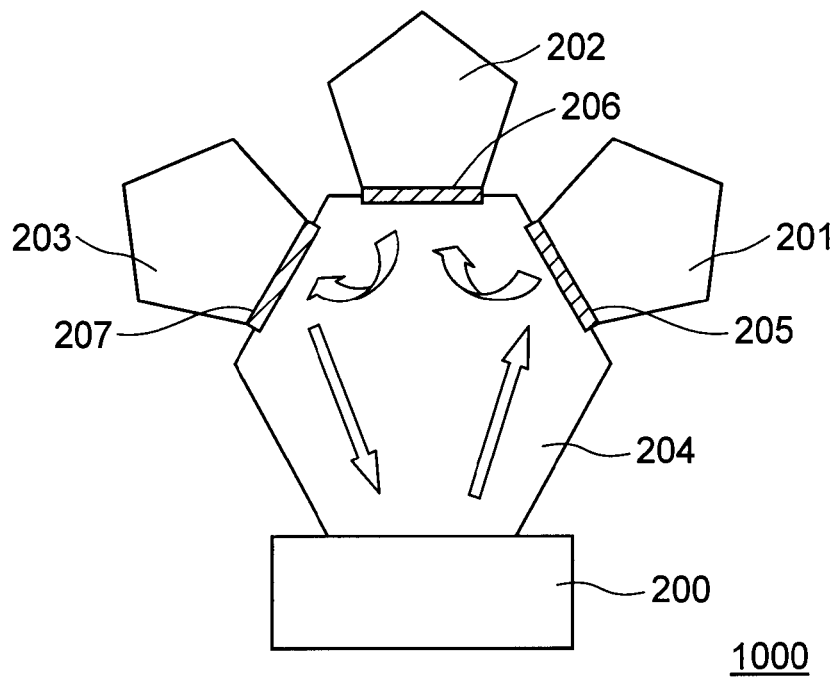
FIG. 10 is a diagram showing an example of a thermal processing equipment 1000 which executes the manufacturing method of the semiconductor device according to the second embodiment.

FIG. 10 is a diagram showing an example of a thermal processing equipment 1000 which executes the manufacturing method of the semiconductor device according to the second embodiment.

As shown in FIG. 10, the thermal processing equipment 1000 includes a load port 200, a first process chamber 201, a second process chamber 202, a third process chamber 203, a transportation chamber 204, a first slit valve 205, a second slit valve 206, and a third slit valve 207.

The first process chamber 201 is configured so as to conduct the first heating processing h1 on the semiconductor substrate 10 in the same way as the first embodiment. The first process chamber 201 can be separated from the transportation chamber 204 by the first slit valve 205. In other words, the first heating processing h1 can be conducted on the semiconductor substrate (wafer) in an atmosphere separated from other process chambers and the transportation chamber, by closing the first slit valve 205.

The second process chamber 202 is configured so as to conduct the second heating processing h2 on the semiconductor substrate 10 in the same way as the first embodiment. The second process chamber 202 can be separated from the transportation chamber 204 by the second slit valve 206. In other words, the second heating processing h2 can be conducted on the semiconductor substrate (wafer) in an atmosphere separated from other process chambers and the transportation chamber, by closing the second slit valve 206.

The third process chamber 203 is configured so as to conduct the third heating processing h3 on the semiconductor substrate 10 in the same way as the first embodiment. The third process chamber 203 can be separated from the transportation chamber 204 by the third slit valve 207. In other words, the third heating processing h3 can be conducted on the semiconductor substrate (wafer) in an atmosphere separated from other process chambers and the transportation chamber, by closing the third slit valve 207.

The load port 200 is configured to load/unload the semiconductor substrate (wafer).

The semiconductor substrate loaded in the load port 200 is transported to the process chambers 201, 202 and 203 via the transportation chamber 204 along a direction indicated by arrows in FIG. 10, and subjected to the first to third heating processing. The semiconductor substrate finished in heating processing is unloaded in the load port 200.

A flow of the first to third heating processing executed by the heating processing equipment 1000 having the configuration heretofore described will now be described.

Figure 11:
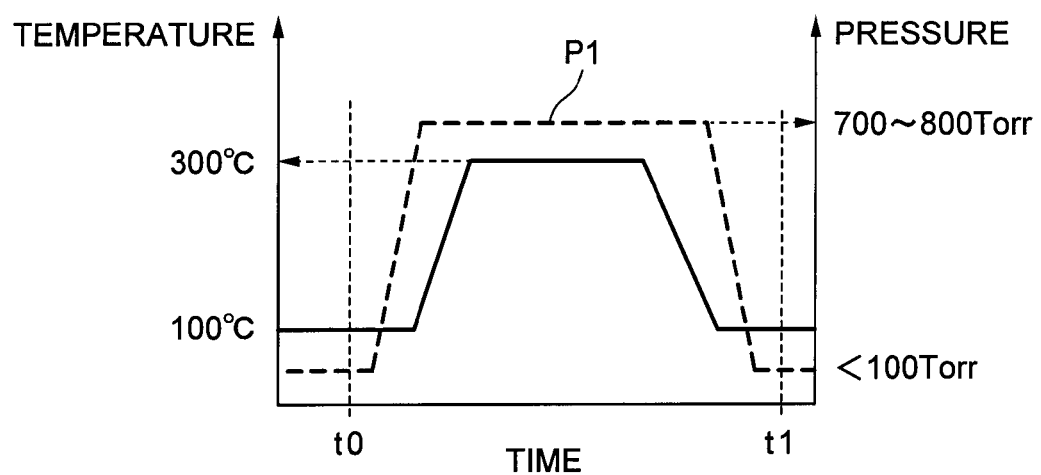
FIG. 11 is a diagram showing a flow of the first heating processing executed by the heating processing equipment 1000 shown in FIG. 10.
Figure 12:
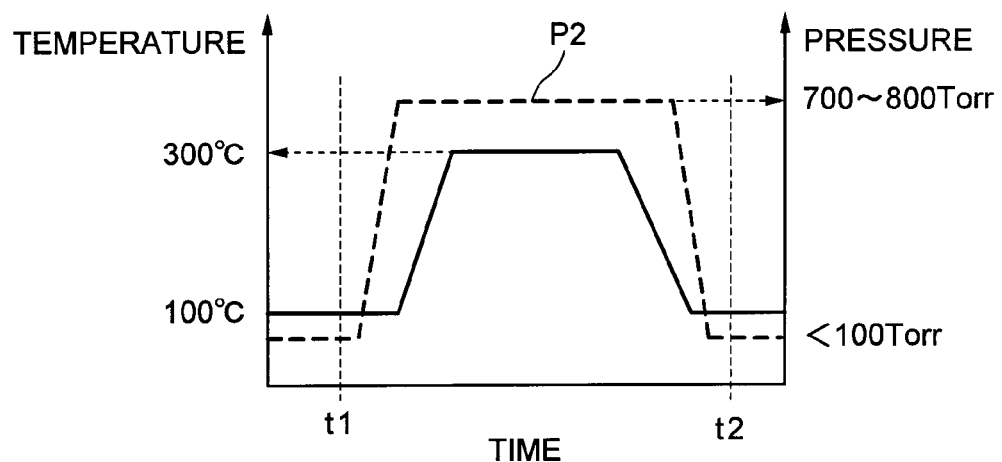
FIG. 12 is a diagram showing a flow of the second heating processing executed by the heating processing equipment 1000 shown in FIG. 10.
Figure 13:
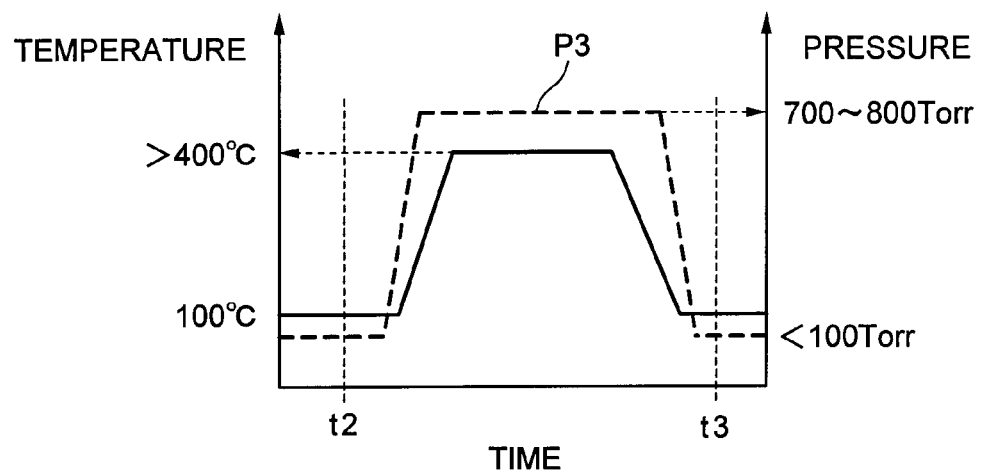
FIG. 13 is a diagram showing a flow of the third heating processing executed by the heating processing equipment 1000 shown in FIG. 10.

FIG. 11 is a diagram showing a flow of the first heating processing executed by the heating processing equipment 1000 shown in FIG. 10. FIG. 12 is a diagram showing a flow of the second heating processing executed by the heating processing equipment 1000 shown in FIG. 10. FIG. 13 is a diagram showing a flow of the third heating processing executed by the heating processing equipment 1000 shown in FIG. 10. In FIGS. 11 to 13, the abscissa axis indicates processing time from the processing start. As for the ordinate axis, the left axis indicates the temperature and the right axis indicates the pressure.

First, the semiconductor substrate is transported to the first process chamber 201, and the first slit valve 205 is closed.

In a section between time t0 and t1 shown in FIG. 11, the first heating processing h1 at the first heating temperature (approximately 300° C.) is conducted in the inert atmosphere (with an oxygen concentration of 1% or less) under the first pressure P1 (in the range of 700 to 800 Torr) in the first process chamber 201.

In the vicinity of the time t1 (between the first heating processing h1 and the subsequent second heating processing h2), the pressure of an atmosphere in the first process chamber 201 in which the semiconductor substrate 10 is placed is depressurized and set equal to a value (100 Torr or less) which is lower than that of the first pressure P1, and the temperature is lowered to approximately 100° C. At this time, the atmosphere in the transportation chamber 204 is already depressurized and set equal to a value (100 Torr or less) which is lower than that of the first pressure P1.

Then, the first slit valve 205 is opened, and the semiconductor substrate is transported to the second process chamber 202 via the transportation chamber 204. At this time, the atmosphere in the second process chamber 202 is the same atmosphere as that in the transportation chamber 204, because the second slit valve 206 is open. Then, the second slit valve 206 is closed.

In a time period between the first heating processing h1 and the second heating processing h2, the pressure of the atmosphere in which the semiconductor substrate is placed is thus set so as to be lower than the first pressure P1 and the second pressure P2.

As a result, the time period required to replace the inert atmosphere in the second process chamber 202 by the oxidizing atmosphere can be shortened.

Then, in a section between the time t1 and t2, the pressure in the second process chamber 202 is raised to the second pressure P2 (in the range of 700 to 800 Torr) by introducing oxygen gas into the second process chamber 202. Subsequently, the second heating processing h2 (thermal oxidation) at approximately 300° C. is conducted in the oxidizing atmosphere (with an oxygen concentration of, for example, 100%) in the second process chamber 202.

In the vicinity of the time t2 (between the second heating processing h2 and the subsequent third heating processing h3), the pressure of an atmosphere in the second process chamber 202 in which the semiconductor substrate 10 is placed is depressurized and set equal to a value (100 Torr or less) which is lower than that of the second pressure P2 and that of the third pressure P3, and the temperature is lowered to approximately 100° C. At this time, the atmosphere in the transportation chamber 204 is already depressurized and set equal to a value (100 Torr or less) which is lower than that of the second pressure P2.

Then, the second slit valve 206 is opened, and the semiconductor substrate is transported to the third process chamber 203 via the transportation chamber 204. At this time, the atmosphere in the third process chamber 203 is the same atmosphere as that in the transportation chamber 204, because the third slit valve 207 is open. Then, the third slit valve 207 is closed.

In a time period between the second heating processing h2 and the third heating processing h3, the pressure of the atmosphere in which the semiconductor substrate is placed is thus set so as to be lower than the second pressure P2 and the third pressure P3.

As a result, the time period required to replace the oxidizing atmosphere in the third process chamber 203 by the inert atmosphere can be shortened.

Then, in a section between the time t2 and t3, the pressure in the third process chamber 203 is raised to the third pressure P3 by introducing nitrogen gas into the third process chamber 203. And the third heating processing h3 at the third processing temperature (400° or more) is conducted in the inert atmosphere (with an oxygen concentration of, for example, 1%) in the process chamber.

In the vicinity of the time t3, the pressure of an atmosphere in the third process chamber 203 in which the semiconductor substrate 10 is placed is depressurized and set equal to a value (100 Torr or less) which is lower than that of the third pressure P3, and the temperature is lowered to approximately 100° C. At this time, the atmosphere in the transportation chamber 204 is already depressurized and set equal to a value (100 Torr or less) which is lower than that of the third pressure P3.

Then, the third slit valve 207 is opened, and the semiconductor substrate is unloaded in the load port 200 via the transportation chamber 204.

Thereafter, the metal oxide film 105 and an unreacted part (not illustrated) of the metallic film 5 on the surface of the element isolating insulation film and the surface of the gate side wall are removed selectively in the step in the first embodiment shown in FIG. 5B.

Owing to the steps executed by the thermal processing equipment heretofore described as well, it is possible to improve the productivity of the semiconductor device while suppressing migration of metal for siliciding and forming a silicide film having a desired film thickness.

In the manufacturing method of the semiconductor device according to the present embodiment, it is possible to improve the productivity of the semiconductor device while forming a desired silicide film, as heretofore described.

What is claimed is:

1. A semiconductor device manufacturing method for forming a MISFET, comprising:
    depositing metal and forming a metal film on a source-drain diffusion layer composed of silicon as a principal ingredient formed in a semiconductor substrate and on an element isolating insulation film formed in the semiconductor substrate in order to be adjacent to the source-drain diffusion layer;
    conducting first heating processing at a first heating temperature in an inert atmosphere under a first pressure in a first process chamber, and thereby causing reaction between silicon in the source-drain diffusion layer and the metal on the source-drain diffusion layer to silicide an upper part of the source-drain diffusion layer and form a silicide film;
    conducting second heating processing at a second heating temperature in an oxidizing atmosphere under a second pressure in a second process chamber to selectively oxidize at least a surface of the metal film on the element isolating insulation film and form a metal oxide film;
    conducting third heating processing at a third heating temperature which is higher than the first heating temperature and the second heating temperature in an atmosphere in a third process chamber to increase a concentration of silicon in the silicide film; and
    selectively removing the metal oxide film and an unreacted part of the metal film on the element isolating insulation film,
    wherein in a time period between the first heating processing and the second heating processing, a pressure of an atmosphere in which the semiconductor substrate is placed is set in order to be lower than the second pressure.

2. The semiconductor device manufacturing method according to claim 1, wherein, in the time period between the first heating processing and the second heating processing, a pressure of an atmosphere in which the semiconductor substrate is placed is set in order to be lower than the first pressure.

3. The semiconductor device manufacturing method according to claim 1, wherein, in the time period between the first heating processing and the second heating processing, a pressure of an atmosphere in which the semiconductor substrate is placed is set equal to the first pressure.

4. The semiconductor device manufacturing method according to claim 1, wherein the first process chamber, the second process chamber, and the third process chamber are one same process chamber.

5. The semiconductor device manufacturing method according to claim 1, wherein, in a time period between the second heating processing and the third heating processing, a pressure of an atmosphere in which the semiconductor substrate is placed is set in order to be lower than the second pressure.

6. The semiconductor device manufacturing method according to claim 1, wherein
    the third heating processing is executed in an inert atmosphere under a third pressure in the third process chamber, and
    in a time period between the second heating processing and the third heating processing, a pressure of an atmosphere in which the semiconductor substrate is placed is set in order to be lower than the third pressure.

7. The semiconductor device manufacturing method according to claim 1, wherein
    the third heating processing is executed in an inert atmosphere under a third pressure in the third process chamber, and
    in a time period between the second heating processing and the third heating processing, a pressure of an atmosphere in which the semiconductor substrate is placed is set equal to the third pressure.

8. The semiconductor device manufacturing method according to claim 1, wherein
    the third heating processing is executed in an oxidizing atmosphere under a third pressure in the third process chamber, and
    in a time period between the second heating processing and the third heating processing, a pressure of an atmosphere in which the semiconductor substrate is placed is set equal to the second pressure and the third pressure.

9. The semiconductor device manufacturing method according to claim 1, wherein the metal is either nickel, cobalt or titanium.

10. The semiconductor device manufacturing method according to claim 9, wherein the metal oxide film and the unreacted part of the metal film are selectively removed by using aqua regia.

11. A semiconductor device manufacturing method for forming a MISFET, comprising:
    depositing metal and forming a metal film on a gate electrode composed of silicon as a principal ingredient and on an insulation film, the gate electrode being formed on a gate insulation film, the gate insulation film being formed on a semiconductor substrate, and the insulation film being formed on both sides of the gate electrode;
    conducting first heating processing at a first heating temperature in an inert atmosphere under a first pressure in a first process chamber, and thereby causing reaction between silicon in the gate electrode and the metal on the gate electrode to silicide an upper part of the gate electrode and form a silicide film;
    conducting second heating processing at a second heating temperature in an oxidizing atmosphere under a second pressure in a second process chamber to selectively oxidize at least a surface of the metal film on the insulation film and form a metal oxide film;

conducting third heating processing at a third heating temperature which is higher than the first heating temperature and the second heating temperature in an atmosphere in a third process chamber to increase a concentration of silicon in the silicide film; and selectively removing the metal oxide film and an unreacted part of the metal film on the insulation film, wherein in a time period between the first heating processing and the second heating processing, a pressure of an atmosphere in which the semiconductor substrate is placed is set in order to be lower than the second pressure.

12. The semiconductor device manufacturing method according to claim 11, wherein, in the time period between the first heating processing and the second heating processing, a pressure of an atmosphere in which the semiconductor substrate is placed is set in order to be lower than the first pressure.

13. The semiconductor device manufacturing method according to claim 11, wherein, in the time period between the first heating processing and the second heating processing, a pressure of an atmosphere in which the semiconductor substrate is placed is set equal to the first pressure.

14. The semiconductor device manufacturing method according to claim 11, wherein the first process chamber, the second process chamber, and the third process chamber are one same process chamber.

15. The semiconductor device manufacturing method according to claim 11, wherein, in a time period between the second heating processing and the third heating processing, a pressure of an atmosphere in which the semiconductor substrate is placed is set in order to be lower than the second pressure.

16. The semiconductor device manufacturing method according to claim 11, wherein the third heating processing is executed in an inert atmosphere under a third pressure in the third process chamber, and in a time period between the second heating processing and the third heating processing, a pressure of an atmosphere in which the semiconductor substrate is placed is set in order to be lower than the third pressure.

17. The semiconductor device manufacturing method according to claim 11, wherein the third heating processing is executed in an inert atmosphere under a third pressure in the third process chamber, and in a time period between the second heating processing and the third heating processing, a pressure of an atmosphere in which the semiconductor substrate is placed is set equal to the third pressure.

18. The semiconductor device manufacturing method according to claim 11, wherein the third heating processing is executed in an oxidizing atmosphere under a third pressure in the third process chamber, and in a time period between the second heating processing and the third heating processing, a pressure of an atmosphere in which the semiconductor substrate is placed is set equal to the second pressure and the third pressure.

19. The semiconductor device manufacturing method according to claim 11, wherein the metal is either nickel, cobalt or titanium.

20. The semiconductor device manufacturing method according to claim 19, wherein the metal oxide film and the unreacted part of the metal film are selectively removed by using aqua regia.

* * * * *